(12) United States Patent
Wadhwa et al.

(10) Patent No.: US 7,057,427 B2
(45) Date of Patent: Jun. 6, 2006

(54) POWER ON RESET CIRCUIT

(75) Inventors: Sanjay Wadhwa, Gurgaon (IN); Kulbhushan Misri, Gurgaon (IN); Deeya Muhury, Ranchi (IN); Murugesan Raman, Madurai (IN)

(73) Assignee: Freescale Semiconductor, INC, Austin, TX (US)

( * ) Notice: Subject to any disclaimer, the term of this patent is extended or adjusted under 35 U.S.C. 154(b) by 95 days.

(21) Appl. No.: 10/892,420

(22) Filed: Jul. 15, 2004

(65) Prior Publication Data

US 2006/0012409 A1    Jan. 19, 2006

(51) Int. Cl.
    *H03K 17/22*    (2006.01)
(52) U.S. Cl. .................................. 327/143; 327/198
(58) Field of Classification Search .................. 327/48, 327/142, 143, 146, 151, 155, 160, 198
    See application file for complete search history.

(56) References Cited

U.S. PATENT DOCUMENTS

| | | | | |
|---|---|---|---|---|
| 4,496,010 A | * | 1/1985 | Chapman, III | 175/4.55 |
| 5,019,996 A | * | 5/1991 | Lee | 702/60 |
| 5,054,000 A | * | 10/1991 | Miyaji | 365/218 |
| 5,144,159 A | | 9/1992 | Frisch et al. | |
| 5,528,184 A | | 6/1996 | Gola et al. | |
| 5,666,088 A | * | 9/1997 | Penza | 331/34 |
| 5,739,708 A | * | 4/1998 | LeWalter | 327/143 |
| 5,917,255 A | | 6/1999 | Ciccone | |
| 6,085,327 A | * | 7/2000 | Seng et al. | 713/300 |
| 6,229,352 B1 | * | 5/2001 | Chevallier et al. | 327/77 |
| 6,430,250 B1 | * | 8/2002 | Ruat et al. | 377/118 |
| 6,747,493 B1 | * | 6/2004 | Ishikawa | 327/143 |
| 2002/0070761 A1 | * | 6/2002 | Abbiate et al. | 327/48 |

OTHER PUBLICATIONS

Yasuda, Takeo et al.; "A Power-On Reset Pulse Generator for Low Voltage Applications"; IEEE International Symposium on Circuits and Systems; May 6-9, 2001; pp. 559–601; vol. 4; IEEE.

* cited by examiner

*Primary Examiner*—Terry D. Cunningham
*Assistant Examiner*—Thomas J. Hiltunen
(74) *Attorney, Agent, or Firm*—Charles Bergere

(57) ABSTRACT

A power on reset (POR) circuit for providing a reset pulse signal to a chip when power supply voltage, VDD, ramps up so that the chip always starts in a known state. The POR circuit generates the reset pulse as soon as VDD exceeds an assertion voltage. The assertion voltage is independent of the ramp rate of VDD. The POR circuit is shut off as soon as the reset signal is generated, thereby drawing zero steady state current from VDD. The re-arm time for the POR circuit is very small. The POR circuit does not reset the chip when there is a dynamic change in VDD.

20 Claims, 6 Drawing Sheets

POWER ON RESET CIRCUIT

BACKGROUND OF THE INVENTION

The present invention relates generally to digital electronics, and more particularly, to a power-on-reset (POR) circuit that provides a reset signal to a chip when the supply voltage ramps up so that the chip always starts with a known state.

A chip typically is made up of various circuit modules that operate together to provide desired functionality. In many applications, upon power on, a chip requires initialization for the proper operation of the circuits. The initialization is performed once the power supply voltage, referred to as VDD, has ramped up to a voltage exceeding a pre-defined threshold value. The initialization enables the various modules and the clock signals to be reset to predetermined values.

A POR circuit performs such initialization. The POR circuit monitors the power supply voltage level and resets various modules within the chip when the power supply voltage level exceeds a predetermined threshold referred to as the assertion voltage. In particular, the POR circuit provides a reliable reset state on power-up. Such functionality prevents the malfunctioning of the chip due to being initialized in an unknown state.

The assertion voltage of a POR circuit should be independent of the ramp-rate of VDD for reliable start up of the chip. The current drawn from the POR circuit should be as small as possible once the reset signal has been generated. Ideally, the POR circuit should draw zero current once the POR action is complete. Further, the POR circuit should have a minimum re-arm time, i.e., the time between two successive VDD ramp-ups, during which VDD remains at zero voltage, should be as small as possible. This is especially desirable in cases where VDD is switched on and off at a high rate.

Additionally, in applications such as Dynamic Voltage Frequency Scaling (DVFS) and deep sleep mode (DSM), the POR circuit should not generate reset pulses while VDD is dynamically varied, for example, between 1.2V to 0.8V. For such applications, the resetting of the chip leads to system failure. Further, it is desirable that the POR circuit be able to work reliably at low-supply voltages, such as 1.2V for current process technology nodes such as 90 nm and 65 nm.

The conventional POR circuit does not satisfy all of the design constraints mentioned above. In particular, the voltage at which the reset occurs varies with the ramp rate for VDD. The POR circuit also consumes a significant amount of constant DC current even if the POR circuit is inactive, such as after the POR action is complete. This leads to unnecessary power consumption. Further, it is not suitable for DVFS/DSM applications since a reset signal is generated even if VDD is varied dynamically.

Accordingly, there is a need for a POR circuit where the assertion voltage is independent of VDD ramp-rate, consumes zero or near zero steady-state current, has a low re-arm time, and is suitable for DVFS/DSM applications.

BRIEF DESCRIPTION OF THE DRAWINGS

The following detailed description of the preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention is directed at a POR circuit that provides a reset signal to a chip when the power supply voltage, VDD, ramps up so that the chip always starts in a known state. In an embodiment of the invention, the POR circuit comprises a detector, an oscillator circuit, a counter and a latch circuit. The detector receives the power supply voltage VDD and generates a detect signal when the supply voltage exceeds a predetermined assertion voltage. The oscillator circuit generates a clock output signal. The counter is connected to the detector and the oscillator circuit and counts cycles of the clock output signal and generates a first counter output signal. The latch circuit is connected to the counter and the detector, and receives the first counter output signal and the detect signal. The latch circuit generates the reset signal for the chip when the first counter output signal reaches a first predetermined count value.

In another embodiment, the POR circuit includes a pulse shaper circuit connected to the detector. The pulse shaper circuit receives the detect signal and generates a flip-flop reset signal that is provided to a reset input of the latch circuit.

The present invention has the advantage that the assertion voltage is independent of the ramp rate of the power supply voltage VDD. Consequently, the behavior of the POR circuit does not vary with the ramp rate of VDD. Further, the POR circuit does not draw any current from VDD once the reset signal is generated. Hence, the power consumption of the circuit is very low. Also, the POR circuit has a very small re-arm time, i.e., the time between two successive VDD ramp-ups in which VDD remains at 0V. As a result, the POR circuit can be used in applications in which VDD is switched ON and OFF at a rapid rate. The POR circuit of the present invention is also suitable for applications such as Dynamic Voltage Frequency Scaling (DVFS) and Deep Sleep Mode (DSM), where VDD varies dynamically from one voltage level to another. The POR circuit does not reset the chip when VDD is dynamically varied. Additionally, the POR circuit works reliably at a low VDD such as 1.2V, thereby making it suitable for current process technologies such as CMOS90.

Figure 1:
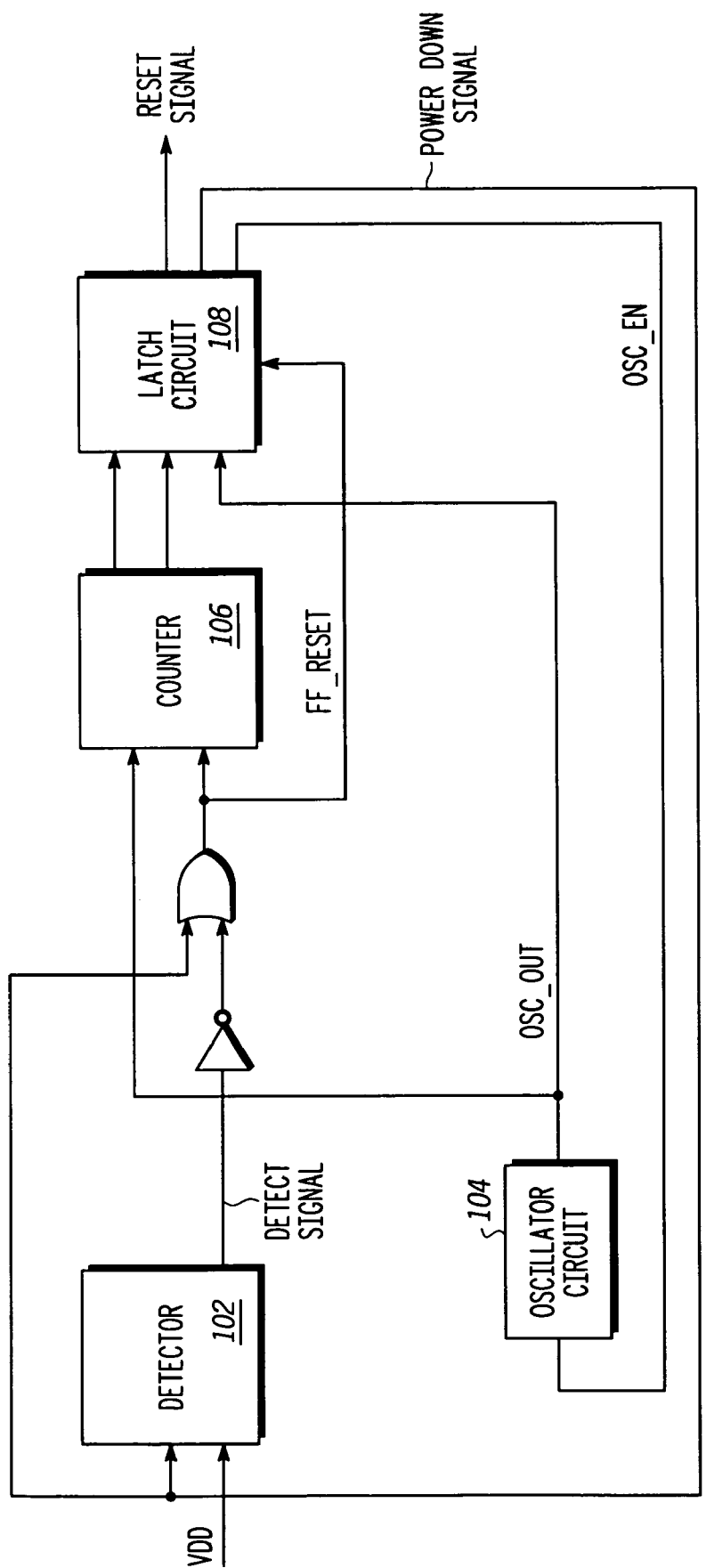
FIG. 1 is a schematic block diagram of a power on reset circuit, in accordance with an exemplary embodiment of the present invention.

FIG. 1 is a block diagram of a POR circuit 100 in accordance with an exemplary embodiment of the present invention. The POR circuit 100 comprises a detector 102, an oscillator circuit 104, a counter 106 and a latch circuit 108. The POR circuit 100 receives VDD as an input, and generates a reset signal that is provided to a chip or other circuit. The reset signal is generated if VDD starts ramping up from zero voltage and increases above a predetermined assertion voltage. For example, one possible scenario arises when the chip is initially powered on, i.e., the source of VDD is turned on. As VDD starts ramping up, the reset signal is generated when VDD exceeds a pre-determined voltage value, referred to as the assertion voltage.

The detector 102 detects and generates a detect signal when VDD exceeds the assertion voltage. The detect signal is a logic high or low signal. The oscillator circuit 104 generates a clock output signal, hereinafter referred to as osc_out.

The counter 106 receives the osc_out signal and either the detect signal or a power down signal from the latch circuit 108. The counter 106 counts clock cycles and generates a first counter output signal and a second counter output signal. In an embodiment of the present invention, a 5-bit counter is used that counts a maximum of 32 clock cycles. The first counter output signal is generated after 16 clock cycles and the second counter output signal is generated after 24 clock cycles. It is to be noted that eight extra cycles are provided to ensure the robustness of the POR circuit 100. In particular, extra clock cycles ensure that the reset signal and the power down signal are not generated at the same time, which can lead to reliability problems.

The first counter output signal is provided to the latch circuit 108. The latch circuit 108 also receives the clock output signal from the oscillator circuit 104. The latch circuit 108 generates the reset signal, which is used to reset the chip, using the first counter output signal. The latch circuit 108 generates a power down signal using the second counter output signal. The power down signal switches off the detector 102 and the oscillator circuit 104 after the generation of reset signal. Consequently, the steady state current drawn by the POR circuit 100 from VDD becomes zero or nearly zero.

Figure 2:
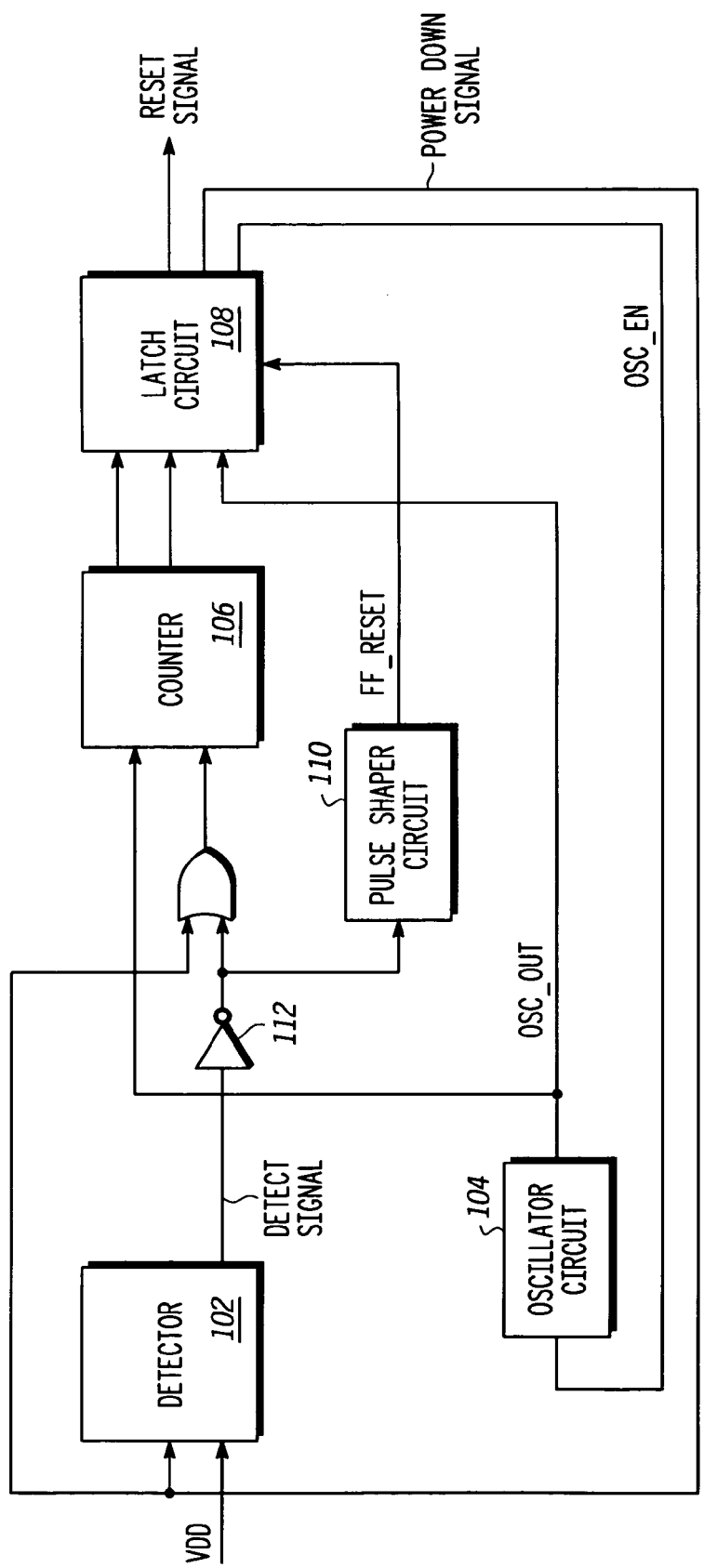
FIG. 2 is a schematic block diagram of a power on reset circuit in an alternate embodiment of the present invention.

FIG. 2 is a schematic block diagram of an alternate embodiment of a POR circuit 200 in accordance with the present invention. In this embodiment, the POR circuit 200 includes a pulse shaper circuit 110 connected to the detector 102. The pulse shaper circuit 110 generates a flip-flop reset signal that resets the latch circuit 108 when VDD starts ramping up from zero. Consequently, all the internal capacitances discharge to zero volts, resulting in a reduction of the re-arm time of the POR circuit 200.

The details of the different modules of the POR circuit 100 are hereinafter described. Unless specified, the bulk of a PMOS transistor is connected to VDD, while the bulk of a NMOS transistor is connected to a reference voltage, referred to as VSS.

Figure 3:
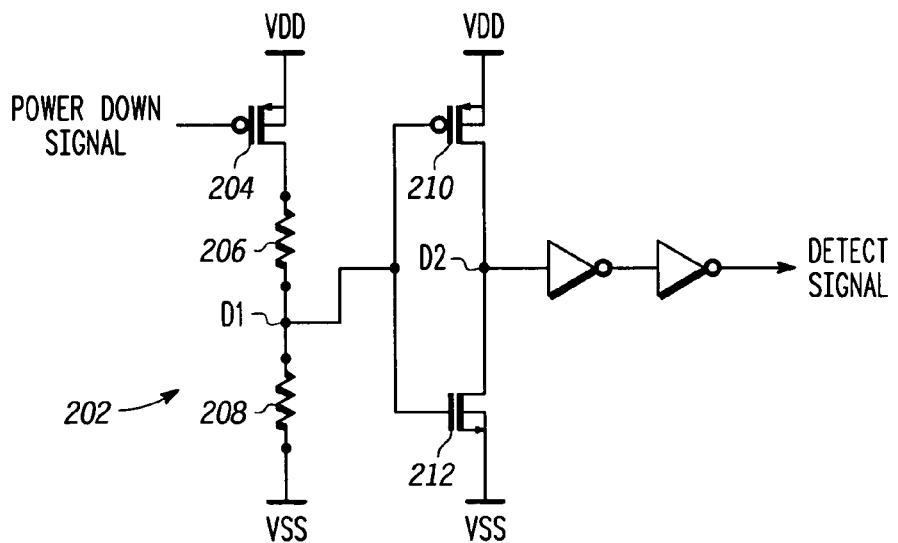
FIG. 3 is a schematic circuit diagram of an exemplary embodiment of a detector used in the POR circuit.

FIG. 3 is a schematic circuit diagram of the detector 102 in an exemplary embodiment of the present invention. The detector 102 includes a resistor divider circuit 202 that generates the detect signal when VDD ramps up above the assertion voltage. The resistor divider circuit 202 comprises a first PMOS transistor 204, a first resistor 206, and a second resistor 208.

The gate of the first PMOS transistor 204 is connected to the power down signal from the latch circuit 108 and the source is connected to VDD. The drain of the first PMOS transistor 204 is connected to a first terminal of the first resistor 206. The second terminal of the first resistor 206 is connected to the first terminal of the second resistor 208 at a node D1. The second terminal of the second resistor 208 is connected to the reference voltage VSS.

The detector 102 includes a second PMOS transistor 210 and a first NMOS transistor 212. The gates of the second PMOS transistor 210 and the first NMOS transistor 212 are connected together at the node D1. The drains of the second PMOS transistor 210 and the first NMOS transistor 212 are connected together at a node D2. The source of the second PMOS transistor 210 is connected to VDD and the source of the first NMOS transistor 212 is connected to VSS. The combination of the second PMOS transistor 210 and the first NMOS transistor 212 acts as an inverter circuit. The output of the inverter circuit, generated at node D2, is further connected to a series of delay circuits to delay the detect signal. In one embodiment, a pair of delay circuits is used to provide the delay. The delay circuits may comprise inverters.

The operation of the resistor divider circuit 202 is hereinafter described. As VDD starts rising from zero volts to its final value, the voltage at node D1 initially remains low. Consequently, the detect signal follows VDD. The first PMOS transistor 204 turns on when VDD exceeds its threshold voltage. Subsequently, the voltage at the node D1 rises. The voltage at the node D1 is given by equation 1:

$$V(D1)=VDD*R2/(R1+R2+R_{ds}) \qquad \text{Eq. 1}$$

where R1=resistance of first resistor 206; R2=resistance of second resistor 208; and $R_{ds}$=resistance of the first PMOS transistor 204 when it is turned ON.

As soon as V(D1) exceeds the trip voltage of the inverter (second PMOS transistor 210 and first NMOS transistor 212), the output of the inverter at node D2, V(D2), becomes low. Consequently, the detect signal also becomes low. The voltage at which the detect signal becomes low is the assertion voltage. By the appropriate selection of the resistances R1, R2, and $R_{ds}$, the assertion voltage can be set at a value that is independent of the ramp rate of VDD. Further, there is no capacitor used at node D1, so only parasitic capacitance is present. Consequently, the time constant at node D1 is very low, compared to the minimum ramp rate of VDD. Hence, V(D1) follows the change in VDD, which ensures that the detect signal is generated at the same assertion voltage for all ramp rates.

Figure 4:
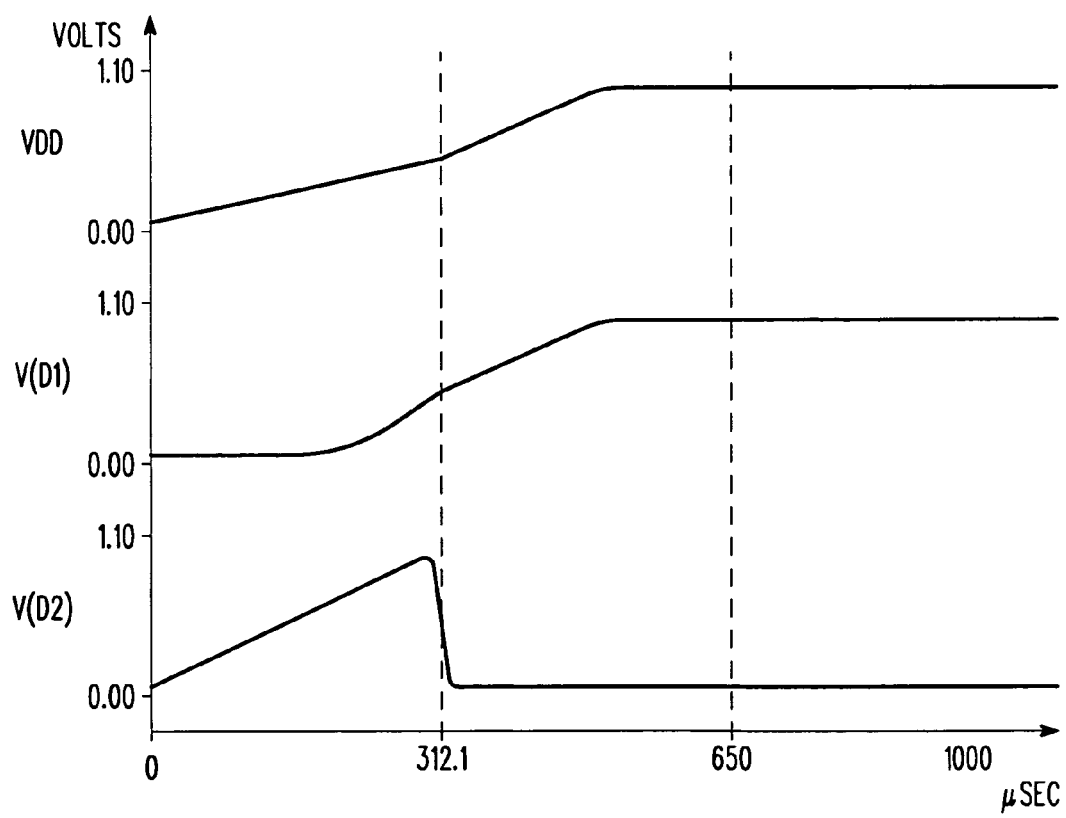
FIG. 4 is a graph of voltage versus time for waveforms of various signals of the detector of FIG. 3.

The behavior of the various nodes of the detector 102 is illustrated in FIG. 4, which depicts the waveforms of various signals (voltage versus time) of the detector 102. In particular, the waveforms of signals corresponding to VDD, the detect signal, and the voltage at nodes D1 and D2 are depicted. As shown, V(D1) follows VDD after the first PMOS transistor 204 turns on, whereas the voltage at node D2 rises sharply and then drops off very rapidly.

Figure 5:
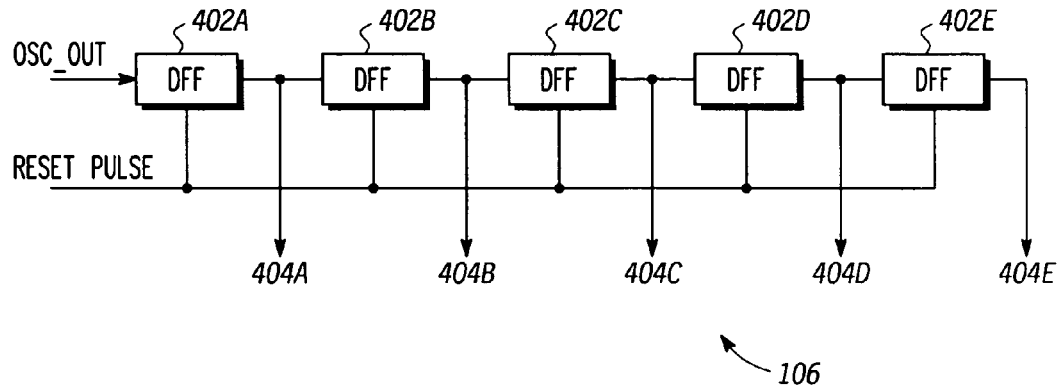
FIG. 5 is a schematic circuit diagram of an exemplary embodiment of a counter used in the POR circuit.

The detect signal, after an inversion, is provided to the counter 106. An exemplary embodiment of the counter 106 is shown in FIG. 5. The counter 106 operates in conjunction with the oscillator circuit 104 and begins counting when either the inverted detect signal or the power down signal goes high. In one embodiment, the counter 106 comprises a 5-bit counter having a series of delay flip-flops 402a, 402b, 402c, 402d and 402e. The outputs of the delay flip-flops 404a, 404b, 404c, 404d, and 404e are used to generate the first and second counter output signals. In one embodiment, the flip-flops 402a to 402e are negative edge triggered.

When VDD starts ramping up from zero volts, the outputs of the flip-flops 404a, 404b, 404c, 404d and 404e are low. When VDD exceeds the assertion voltage, the counter 106 is activated and starts counting the osc_out signal from the oscillator circuit 104. The counter 106 counts twenty-four (24) cycles of the osc_out signal. After sixteen (16) cycles, the counter 106 generates the first counter output, which goes high for one cycle. The first counter output signal is used to generate the reset signal for resetting the chip. The second counter output signal is generated after another eight cycles. The second counter output signal is used to generate the power down signal that shuts off the POR circuit 100.

It is to be noted that the counter 106 is described by using a five-bit counter for illustration purposes only. It will be understood by those of skill in the art that an n-bit counter can be used, where 'n' is based on the application and the period of the osc_out signal. The outputs of the counter 106 are provided to the latch circuit 108.

Figure 6:
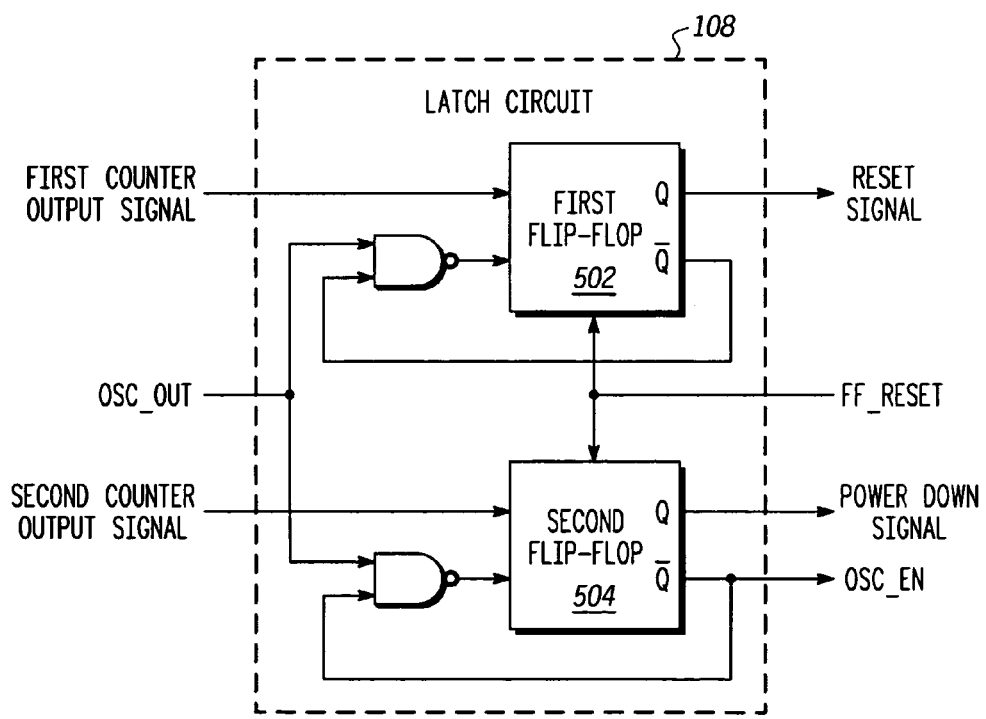
FIG. 6 is a schematic circuit diagram of an exemplary embodiment of a latch circuit used in the POR circuit.

An exemplary embodiment of the latch circuit 108 is shown in FIG. 6. The latch circuit 108 comprises first and second flip-flops 502 and 504. In an embodiment of the present invention, the first and second flip-flops 502 and 504 are negative edge triggered. The first flip-flop 502 latches the first counter output signal and the second flip-flop 504 latches the second counter output signal. The first and second flip-flops 502 and 504 have as their respective clock inputs a NAND of their /Q (Qbar) output and the osc_out signal from the oscillator circuit 104. The first and second flip-flops 502 and 504 have the same reset signal, which is the ff_reset signal. In the first embodiment (FIG. 1), the ff_reset signal is the output of an OR gate 114, which has as its inputs the power down signal (output by the second latch 504) and the inverted detect signal output by the inverter 112. In the second embodiment (FIG. 2), the ff_reset signal is generated by the pulse shaper circuit 110.

The outputs of the latch circuit 108 (the reset signal and the power down signal) are low if the ff_reset signal is low. More particularly, the first flip-flop 502 generates the reset signal. The first flip-flop 502 receives the first counter output signal and generates the reset signal when the first counter output signal goes high. In operation, the first counter output signal is logic high for a single clock cycle, which triggers the generation of the reset signal.

Similarly, the second flip-flop 504 latches the second counter output signal to generate the power down signal. The power down signal is provided to the detector 102 and the counter 106. The /Q (Qbar) output of the second flip-flop 504, hereinafter referred to as osc_en, is provided as an input to the oscillator circuit 104. When ff_reset is low, osc_en is high, which turns on the oscillator circuit 104. The power down signal is provided to the detector 102 and the counter 106 and inhibits the detector 102 and the counter 106 from drawing current from VDD once it goes high.

Figure 7:
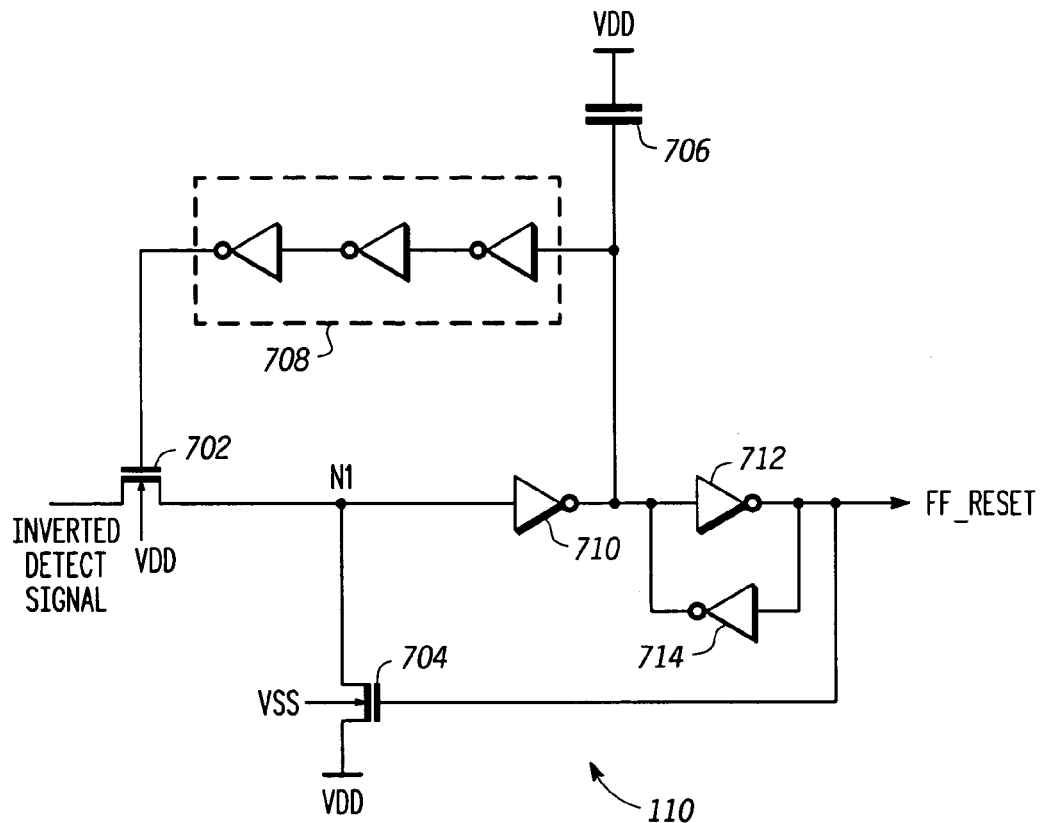
FIG. 7 is a schematic block diagram of an exemplary embodiment of a pulse shaper circuit used in the POR circuit.

FIG. 7 is a schematic circuit diagram of an exemplary embodiment of the optional pulse shaper circuit 110. The pulse shaper circuit 110 comprises a first PMOS transistor 702, a first NMOS transistor 704, a capacitor 706, a plurality of series connected first inverters 708, a second inverter 710, a third inverter 712, and a fourth inverter 714.

The source of the first PMOS transistor 702 receives an inverted detect signal. That is, in FIG. 2, the detect signal generated by the detector 102 is provided to an inverter 112, which generates an inverted detect signal. The drain of the first PMOS transistor 702 is connected to the source of the first NMOS transistor 704 at a node N1. The drain of the first NMOS transistor 704 is connected to VDD. The first terminal of the capacitor 706 also is connected to VDD. The second terminal of the capacitor 706 is connected to the input of the first inverter of the series connected first inverters 708. The output of the last inverter of plurality of series connected first inverters 708 is connected to the gate of the first PMOS transistor 702. The input of the second inverter 710 is connected to the node N1 and the output of the second inverter 710 is connected to the input of the third inverter 712, and to the second terminal of the capacitor 706. The output of the third inverter 712 is connected to the gate of the first NMOS transistor 704 and to the input of the fourth inverter 714. The output of the fourth inverter 714 is connected to the input of the third inverter 712. The output of the third inverter 712 is provided as the flip-flop reset signal, ff_reset, to the first and second flip-flops 502 and 504 of the latch circuit 108 (FIGS. 1 and 2).

The operation of the pulse shaper circuit 110 is hereinafter described. When VDD starts rising from 0V, voltage across the capacitor 706 is also 0V, therefore, the second terminal of the capacitor 706 starts following VDD. When the voltage at the second terminal of the capacitor 706 exceeds the trip voltage for the third inverter 712, the output of the pulse shaper circuit 110 turns low. This output signal, ff_reset, in turn, resets latch circuit 108. Consequently, the reset signal and the power down signal are turned off. In this way, as soon as VDD starts rising from zero voltage, the reset signal and the power down signal are reset, which reduces the re-arm time of the POR circuit 100. For improved performance, the tripping voltage of the third inverter 712 is kept as small as possible. In an embodiment of the present invention, the trip voltage is from about 200–300 mV.

As VDD further increases, the voltage at the second terminal of the capacitor 706 further increases. When this voltage exceeds the trip voltage of the first inverter in the series connected first inverters 708, the gate of the first PMOS transistor 702 goes low. Consequently, the first PMOS transistor 702 is turned ON. Subsequently, when VDD exceeds the assertion voltage, the input (inverted detect signal) to the pulse shaper circuit 110 goes high. As a result, the input of the second inverter 710 goes high, and correspondingly, the output of the pulse shaper circuit 110 goes high and the capacitor 706 is charged to VDD. As a result, the voltage at the gate of the first PMOS transistor 702 increases, which turns off the first PMOS transistor 702, even though the output of the pulse shaper circuit 110 is high. However, this can cause the input to the second inverter 710 to be discharged due to leakage currents resulting in the resetting of the latch circuit 108. This scenario is avoided by use of the first NMOS transistor 704. The first NMOS transistor 704 turns on as soon as the output of the pulse shaper circuit 110 goes high. Consequently, the input to the second inverter 710, which also is connected to the source of the first NMOS transistor 704, does not fall below (VDD−Vtn), wherein Vtn is the threshold voltage of the first NMOS transistor 704.

For the POR circuit 100, the time duration between successive VDD ramp-ups is around 1 ms. On the other hand, for the POR circuit 200 with the pulse shaper circuit 110, the time duration between successive VDD ramp-up is around 0.1 ms, i.e., a reduction in re-arm time by an order of 10.

Figure 8:
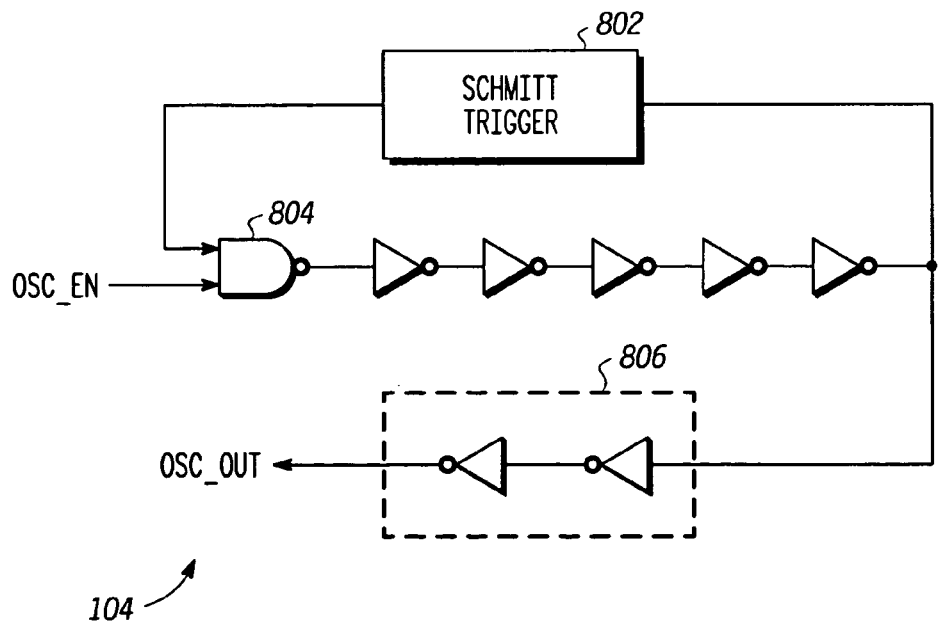
FIG. 8 is a schematic circuit diagram of an exemplary embodiment of an oscillator circuit used in the POR circuit.

FIG. 8 is a schematic circuit diagram of an exemplary embodiment of the oscillator circuit 104 of the present invention. The oscillator circuit 104 comprises a Schmitt trigger 802, a NAND gate 804 and a delay circuit 806. The Schmitt trigger 802 generates a cyclical clock signal using a seven-stage ring oscillator, six stages being simple inverters and one stage being a Schmitt trigger. The implementation of Schmitt triggers is known in the art and thus a detailed description thereof is not necessary for a complete understanding of the invention. The NAND gate 804 receives as inputs the output of the Schmitt trigger 802 and the osc_en signal from the latch circuit 108. The output of the NAND gate 804 is an osc_out signal. The osc_out signal is provided to the delay circuit 806, which delays the osc_out signal, as necessary. The delay circuit 806 preferably comprises an even number of series connected inverters. The amount of delay required depends on the desired application. The delay circuit 806 sharpens the rise and fall of the osc_out signal. In one embodiment, the delay circuit 806 comprises a pair of series connected inverters.

Figure 9:
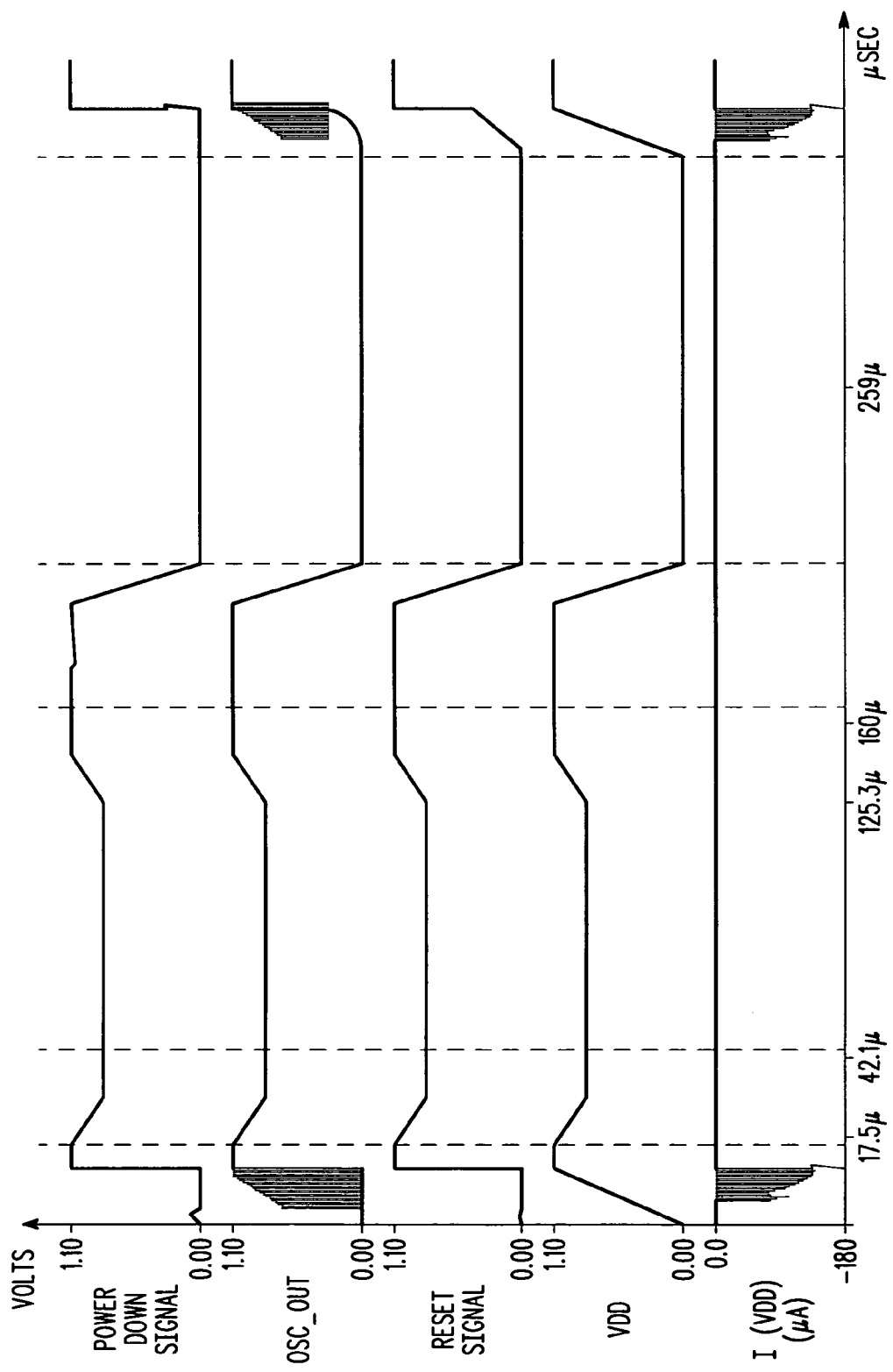
FIG. 9 illustrates waveforms for the various signals of the POR circuit in an exemplary embodiment of the present invention.

The behavior of the POR circuit 100 is illustrated at FIG. 9, which shows simulation waveforms of voltage versus time for VDD, the reset signal, the osc_out signal, and the power down signal for a VDD ramp rate of 10 uS. In addition, the current drawn from VDD also is shown. As can be seen, the current drawn by the POR circuit is near zero as soon as the power down signal goes high. Further, if VDD is reduced from 1.1V to 0.7V, as is normally done in DVFS and DSM situations, the reset signal and the power down signal follows VDD, i.e., POR circuit 100 does not reset the connected chip again.

The POR circuit 100 is generally ramp-rate independent at any temperature and at a particular process corner. That is, at a particular process corner at which the chip has been fabricated, the assertion voltages at various ramp rates, as well various temperatures are substantially the same. For example, at VDD=1.1V, if Field Effect Transistors (FET) are used, then at a temperature of −40 C the assertion voltages are about 681.9 mV, 678.2 mV, and 677.9 mV for ramp rates of 50 us, 500 us and 25 ms, respectively.

While various embodiments of the invention have been illustrated and described, it will be clear to those of skill in the art that the invention is not limited to these embodiments only. Numerous modifications, changes, variations, substitutions and equivalents will be apparent to those skilled in the art, without departing from the spirit and scope of the invention, as described in the claims.

The invention claimed is:

1. A power on reset circuit that generates a reset signal, comprising:
a detector that receives a supply voltage and generates a detect signal when the supply voltage exceeds a predetermined voltage value;
an oscillator circuit that generates a clock output signal;
a counter, connected to the detector and the oscillator circuit, wherein when the detect signal is one of high and low, the counter counts cycles of the clock output signal and generates a first counter output signal at a first predetermined count value and a second counter output signal at a second predetermined count value; and
a latch circuit, connected to the counter and the detector and receiving the first counter output signal, the second counter output signal, and the detect signal, wherein when the counter reaches the first predetermined count value, the latch circuit activates the reset signal, and when the counter reaches the second predetermined count value, the latch circuit activates a power down signal that is provided to the detector and the oscillator circuit.

2. The power-on-reset circuit of claim 1, wherein the detector comprises:
a resistor divider circuit for generating the detect signal when the supply voltage ramps up above the predetermined voltage value.

3. The power on reset circuit of claim 2, wherein the resistor divider circuit comprises:
a first PMOS transistor having a gate connected to the power-down signal, and a source connected to the supply voltage;
a first resistor having a first terminal connected to a drain of the first PMOS transistor; and
a second resistor having a first terminal connected to a second terminal of the first resistor, and a second terminal connected to a reference voltage, wherein the detect signal is generated at a node between the first and second resistors.

4. The power on reset circuit of claim 2, wherein the detector further comprises:
a first PMOS transistor having a gate connected to the power-down signal, and a source connected to the supply voltage;
a first resistor having a first terminal connected to a drain of the first PMOS transistor;
a second resistor having a first terminal connected to a second terminal of the first resistor, and a second terminal connected to a reference voltage;
a second PMOS transistor having a gate connected to the node between the first and second resistors, and a source connected to the supply voltage; and
a first NMOS transistor having a gate connected to the node between the first and second resistors, a drain connected to a drain of the second PMOS transistor, and a source connected to the reference voltage, wherein the detect signal is generated at a node between the second PMOS transistor and the first NMOS transistor.

5. The power on reset circuit of claim 1, wherein the latch circuit comprises:
a first flip-flop that latches the first counter output signal and generates the reset signal; and
a second flip-flop that latches the second counter output signal and generates the power down signal.

6. The power on reset circuit of claim 5, wherein the first predetermined count value is sixteen and the second predetermined count value is twenty-four.

7. The power on reset circuit of claim 5, wherein the detect signal is provided to a reset input of the first and second flip-flops.

8. The power on reset circuit of claim 7, wherein a combination of the clock output signal and the first flip-flop output signal is provided to the first flip-flop clock input and a combination of the clock output signal and the second flip-flop output signal is provided to the second flip-flop clock input.

9. The power on reset circuit of claim 5, further comprising a pulse shaper circuit, connected to the detector and receiving the detect signal, and generating a flip-flop reset signal that is provided to a reset input of the first and second flip-flops.

10. The power on reset circuit of claim 9, wherein the pulse shaper circuit resets the first and second flip-flops when the supply voltage starts ramping up from zero, and prevents the first and second flip-flops from being reset after the power-down signal is generated.

11. The power on reset circuit of claim 1, wherein the predetermined voltage value detected by the detector is adjustable.

12. The power on reset circuit of claim 1, wherein the counter is a five bit counter and counts up to 32 clock cycles of the clock output signal.

13. The power on reset circuit of claim 1, wherein the oscillator circuit comprises a ring oscillator.

14. The power on reset circuit of claim 13, wherein the oscillator circuit comprises a seven-stage oscillator with a Schmitt trigger.

15. A power on reset circuit that generates a reset signal, comprising:
   a detector that receives a supply voltage and generates a detect signal when the supply voltage exceeds a predetermined voltage value during ramp-up, wherein the detector includes a resistor divider circuit for generating the detect signal when the supply voltage ramps up above the predetermined voltage value;
   an oscillator circuit that generates a clock output signal;
   a counter, connected to the detector and the oscillator circuit, wherein when the detect signal is one of high and low, the counter counts cycles of the clock output signal and generates first and second counter output signals; and
   a latch circuit, connected to the counter and the detector and receiving the first and second counter output signals and the detect signal, wherein when the first counter output signal reaches a first predetermined count value, the latch circuit activates the reset signal and when the second counter output signal reaches a second predetermined value, the latch circuit activates a power down signal that is provided to the detector and the oscillator circuit.

16. The power on reset circuit of claim 15, further comprising:
   a PMOS transistor having a gate connected to the power-down signal, and a source connected to the supply voltage;
   a first resistor having a first terminal connected to a drain of the PMOS transistor;
   a second resistor having a first terminal connected to a second terminal of the first resistor, and a second terminal connected to a reference voltage; and
   an inverter connected between the supply voltage and the reference voltage, wherein an input of the inverter is connected to a node between the first and second resistors, and an output of the inverter provides the detect signal.

17. The power on reset circuit of claim 16, wherein the latch circuit comprises:
   a first flip-flop that latches the first counter output signal and generates the reset signal; and
   a second flip-flop that latches the second counter output signal and generates the power down signal.

18. The power on reset circuit of claim 17, further comprising a pulse shaper circuit, connected to the detector and receiving the detect signal, and generating a flip-flop reset signal that is provided to a reset input of the first and second flip-flops, wherein flip-flop reset signal resets the first and second flip-flops when the supply voltage starts ramping up from zero, and prevents the first and second flip-flops from being reset after the power-down signal is generated.

19. The power on reset circuit of claim 18, wherein the pulse shaper circuit comprises:
   a first PMOS transistor having a source that receives the detect signal;
   a first NMOS transistor having a source connected to a drain of the first PMOS transistor, a bulk connected to the reference voltage, and a drain connected to the supply voltage;
   a capacitor having a first terminal connected to the supply voltage, and a second terminal;
   a plurality of series connected first inverters in odd number, a first one in the series having an input connected to the second terminal of the capacitor and a last one in the series having an output connected to a gate of the first PMOS transistor;
   a second inverter having an input connected to a node between the drain for the first PMOS transistor and the source of the first NMOS transistor;
   a third inverter having an input connected to the second terminal of the capacitor and an output of the second inverter, and an output connected to the gate of the first NMOS transistor; and
   a fourth inverter having an input connected to an output of the third inverter and an output connected to the input of the third inverter, wherein the flip-flop reset signal is provided at the output of the third inverter.

20. A power on reset circuit that generates a reset signal, comprising:
   a detector that receives a supply voltage and generates a detect signal when the supply voltage exceeds a predetermined voltage value;
   an oscillator circuit that generates a clock output signal;
   a counter, connected to the detector and the oscillator circuit, wherein when the detect signal is one of high and low, the counter counts cycles of the clock output signal and generates a first counter output signal and a second counter output signal;
   a latch circuit, connected to the counter and the detector and receiving the first and second counter output signals and the detect signal, wherein when the first counter output signal reaches a first predetermined count value, the latch circuit activates the reset signal and when the second counter output signal reaches a second predetermined count value, the latch circuit activates a power down signal that is provided to the detector and the oscillator circuit; and
   a pulse shaper circuit, connected to the detector and receiving the detect signal, and generating a flip-flop reset signal that is provided to a reset input of the latch circuit.

* * * * *